(12) United States Patent
Wang et al.

(10) Patent No.: US 6,654,711 B1
(45) Date of Patent: *Nov. 25, 2003

(54) CORRECTION FACTORS FOR THE ANALYSIS OF PIEZOELECTRIC DEVICES

(75) Inventors: Ji Wang, Sunnyvale, CA (US);
Jiun-Der Yu, Mountain View, CA (US);
Yook-Kong Yong, Princeton, NJ (US);
Tsutomu Imai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/333,721

(22) Filed: Jun. 15, 1999

(51) Int. Cl.[7] .................. G06F 17/50; G06F 17/10; G06F 7/60; G06G 7/62

(52) U.S. Cl. .................. 703/13; 703/14; 703/2; 703/7

(58) Field of Search ................... 703/2, 4, 6–7

(56) References Cited

U.S. PATENT DOCUMENTS

| | | | |
|---|---|---|---|
| 4,039,969 A | 8/1977 | Martin | |
| 4,071,786 A | 1/1978 | Yamashita | |
| 4,167,686 A | 9/1979 | Fukuyo | |
| 4,281,298 A | 7/1981 | Gounji et al. | |
| 4,306,170 A | 12/1981 | Motte et al. | |
| 4,333,842 A | 6/1982 | Ito et al. | |
| 4,388,548 A | 6/1983 | Vangheluwe | |
| 4,511,202 A | 4/1985 | Kasai | |
| 4,716,332 A | 12/1987 | Hayashi | |
| 4,894,577 A | 1/1990 | Okamoto et al. | |
| 5,112,642 A | * 5/1992 | Wajid | 427/10 |
| 5,548,178 A | 8/1996 | Eda et al. | |
| 5,675,208 A | 10/1997 | Huang et al. | |
| 6,230,113 B1 | * 5/2001 | Wang et al. | 703/1 |

OTHER PUBLICATIONS

Yong et al.; "Frequency–temperature effects in three–dimensional surface acoustic wave periodic structures", IEEE Proc. Int. Freq. Control Symp.; 915–921; Apr. 1999.*

Yu; "Second–order analysis of free vibrations of piezoelectric ceramic actuators"; IEEE Freq. Control Symp.; pp. 695–702; May 1998.*

Lee et al.; "A new 2–D theory for vibrations of piezoelectric crystal plates with electroded faces"; IEEE Ultrasonics Symp.; pp. 1591–1594; Nov. 1996.*

Yong et al., "Accuracy of crystal plate theories for high–frequency vibrations in the range of the fundamental thickness shear mode"; IEEE Trans. Ultrasonics, Ferroelectrics and frequency control; pp. 888–892; Sep. 1996.*

Yong et al. "On the acurracy of plate theories for the prediction of unwanted modes near the fundamental thickness shear mode."; Proc. Frequency Control Symp.; pp. 755–760; Jun. 1995.*

Lee et al.; "A two–dimensional theory for high–frequency vibrations of piezoelectric crystal plates with or without electrodes"; J, Appl. Phys.; 61 (4); pp. 1249–1262; 1987.*

Yong et al.; "Numerical algorithms and results for SC–cut Quartz plates vibrating at the third harmonic overtone of thickness shear"; IEEE Trans. Ultrasonics, Ferroelectrics and Freq. Control; pp. 685–693; 1994.*

(List continued on next page.)

*Primary Examiner*—Hugh Jones
(74) *Attorney, Agent, or Firm*—Michael T. Gabrik

(57) ABSTRACT

Techniques are provided for determining certain correction factors and using these correction factors in analyzing the vibration frequency characteristics of a piezoelectric material. The correction factors are developed based on the Mindlin plate theory and are introduced to correct the inaccuracies of higher-order thickness-shear cut-off frequencies. The analysis is preferably carried out during the design of a piezoelectric device incorporating the piezoelectric material and before production of the piezoelectric device. The design state may also include determining whether the device and its electrodes exhibit appropriate stiffness characteristics.

25 Claims, 4 Drawing Sheets

OTHER PUBLICATIONS

Midlin; "High frequency vibrations of piezoelectric crystal plates"; Int. J. Solids Structures; pp. 895–906, 1972.*

Brissaud, M. "characterization of Piezoceramics," Trans. on Ultrasonics, Ferroelectrics and Frequency Control, vol. 38, No.6, Nov. 1991, pp. 603–617.

Lerch, R. "Finite Element Analysis of Piezoelectric Transducers," IEEE Proc. of Ultrasonics Symposium, vol. 2, Oct. 1988, pp. 643–654.

Wang, J. et al. "Finite Element Analysis of the Piezoelectric Vibrations of Plate Resonators with Higher–Order Plate Theory," Proc. of 1997 IEEE Int'l Frequency Control Symposium, May 1997, pp. 650–658.

Yong, Y. K. "Third–Order Mindlin Plate Theory Predictions for the Frequency–Temperature Behavior of Straight Crested Wave Modes in AT–and SC–Cut Quartz Plates" $50^{th}$ Proc of the 1996 IEEE Int'l Frequency Control Sysmposium. Jun. 5–7, 1996, pp. 648–656.

Zhang, Z. et al. "Numerical Analysis of Thickness Shear Thin Film Piezoelectric Resonators Using a Laminated Plate Theory." Trans. on Ultrasonics, Ferroelectrics and Frequency Control, vol. 42, No. 4, Jul. 1995, pp. 734–746.

Yong, Y. et al. "A Perturbation for Finite Element Modeling of Piezoelectric Vibrations in Quartz Plate Resonators," Trans. on Ultrasonics, Ferroelectrics and Frequency Control, vol. 40, No. 5, Sep. 1993, pp. 551–562.

Wang, J. et al. "A New Theory for Electroded Piezoelectric Plates and its Finite Element Application for the Forces Vibrations Analysis of Quartz Crystal Resonators" IEEE Proceedings of Ultrasonics Symposium. vol. 1, Oct 5–8, 1998, pp. 913–918.

Yong, Y. K. et al. "A Set of Hierarchical Finite Elements for Quartz Plate Resonators" IEEE Proc. of Ultrasonics Symposium. vol. 2, Nov. 3–6, 1996, pp. 981–985.

Wang, J. et al. "The Piezoelectrically Forced Vibrations of AT–cut Quartz Strip Resonators" $50^{th}$ Proc. of the 1996 International Frequency Control Symposium Jun. 5–7, 1996, pp. 390–397.

* cited by examiner

CORRECTION FACTORS FOR THE ANALYSIS OF PIEZOELECTRIC DEVICES

CROSS-REFERENCE TO RELATED APPLICATION

This application is related to application Ser. No. 09/212,816, entitled "Stiffness Effects in Piezoelectric Devices", filed Dec. 16, 1998, the contents of which are incorporated by reference herein.

BACKGROUND OF THE INVENTION

1. Field of the Invention

This invention relates to techniques for developing certain correction factors and using these correction factors in analyzing the vibration frequency and displacement characteristics of a piezoelectric material. Such analysis is preferably carried out during the design of a piezoelectric device incorporating the piezoelectric material before production of the piezoelectric device. The design may also include additional design-based analysis such as determining whether the device and its electrodes exhibit appropriate stiffness characteristics.

2. Description of the Related Art

A wide variety of piezoelectric devices are used in various electronic applications. One common type of piezoelectric device is a crystal resonator. A typical crystal resonator includes a layer of crystalline piezoelectric material having opposite faces, each having a corresponding electrode bonded thereto to sandwich the piezoelectric material between the electrodes. The crystal resonator vibrates in response to an electrical stimulus applied to the electrodes. The vibration induces a highly stable electrical oscillation across the electrodes that is useful for timing other devices.

For a piezoelectric device to operate properly, it is important for its vibration frequency and displacement characteristics to fall within design specifications. For example, if the elastic properties of its piezoelectric material falls outside design specifications, the piezoelectric device may not have the desired oscillation frequency or magnitude response. Unfortunately, it has proven very difficult to precisely determine such elastic properties of piezoelectric materials. One reason for this difficulty is that there is considerable interplay between the various elastic properties of a piezoelectric material.

Due to such difficulties, piezoelectric devices generally are formed in a rough state that is not guaranteed to be within final design specifications. The piezoelectric devices may then be brought into final design specifications by adding or removing material from the piezoelectric device. In one conventional approach, material is added or removed from electrodes. In another conventional approach, stiffening electrical fields are applied to a piezoelectric device during operation. In a third conventional approach, a piezoelectric device is stiffened to reduce acceleration sensitivity by adding one or more braces either on the electrodes or on the layer of piezoelectric material.

Such conventional approaches to providing piezoelectric devices with desired elastic properties have several drawbacks. They are not truly design based, but rather require extra fabrication steps, such as adding or removing material from electrodes, or special operating environments, such as appropriate stiffening electrical fields. Generation of stiffening electrical fields may require additional circuitry. Conventional approaches typically also require the formation of various prototype devices to determine how to fabricate the piezoelectric device with a suitable rough state as described above. Further, conventional approaches are believed to work poorly where electrode thickness exceeds about two percent of total device thickness.

Patent application Ser. No. 09/212,816, entitled "Stiffness Effects in Piezoelectric Devices", filed Dec. 16, 1998 provides a design-based system and method for verifying designs of piezoelectric devices during the design process and before any manufacturing steps are carried out. In particular, the system and method verifies whether the electrodes have the appropriate stiffness characteristics. With such a system and method extra fabrication steps and generation of special operating environments are avoided. The application also provides improved piezoelectric devices that meet final design specifications while reducing the need for post-production processing of the devices.

SUMMARY OF THE INVENTION

It is therefore an object of the present invention to provide further improvements in the designed-based analysis and verification of design parameters of piezoelectric devices.

It is another object of this invention to provide techniques for developing certain correction factors and using these correction factors in performing vibration frequency analysis of the piezoelectric material of the piezoelectric device which analysis can conveniently be performed before any manufacturing steps.

These correction factors are developed based on certain modeling equations which describe particular physical characteristics of the piezoelectric material, such as stress, strain, displacement and frequency, and are used to perform vibration frequency analysis of the piezoelectric material which may include, for example, determining fundamental thickness-shear frequency and coupling of the thickness-shear vibration mode with other vibrations modes such as the flexure vibration mode.

According to one aspect of the invention, a method is provided for verifying a design of a piezoelectric device which includes a piezoelectric material that preferably has a plate configuration and is made of AT-cut crystal. The method comprises forming a model of the piezoelectric material, wherein the model includes at least one correction factor; and analyzing the model of the piezoelectric material to determine one or more vibration frequency characteristics of the piezoelectric material to determine whether the piezoelectric material meets a design specification. Vibration frequency characteristics that are determined preferably include a fundamental thickness-shear frequency of the piezoelectric material and coupling characteristics between a thickness-shear vibration mode of the piezoelectric material and another vibration mode such as a flexural vibration mode. Preferably, the correction factor(s) is/are developed by forming a series of models of the piezoelectric material including a stress-strain model, a motion model based on the stress-strain model, and a frequency model based on the other two models.

In another aspect of the invention, the above-described method is implemented on an apparatus such as a computer system using hardware, software or combination thereof. When software is used, it is preferably embodied on a machine-readable medium such as a computer system or other processor-controlled device. When hardware is used to implement the invention, various circuit components including application specific integrated circuits (ASICs), digital signal processing circuits and the like may used.

In yet another aspect of the invention, a piezoelectric device is provided. The device comprises a piezoelectric material having a plate configuration and at least one electrode affixed thereto. A model of the piezoelectric material, including at least one correction factor, is formed and analyzed during a design of the device to determine one or more vibration frequency characteristics of the piezoelectric material to determine whether the piezoelectric material meets a design specification to reduce requirements for post-production processing of the device.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

The present invention provides a system and method for developing correction factors and applying these correction factors in a design-based analysis of vibration frequency characteristics of piezoelectric materials to be used in piezoelectric devices before such devices are manufactured. The present invention also provides improved piezoelectric devices whose vibration frequency characteristics have been determined during a design stage, thereby reducing post-production processing requirements of the devices relative to conventional piezoelectric devices.

Figure 1:
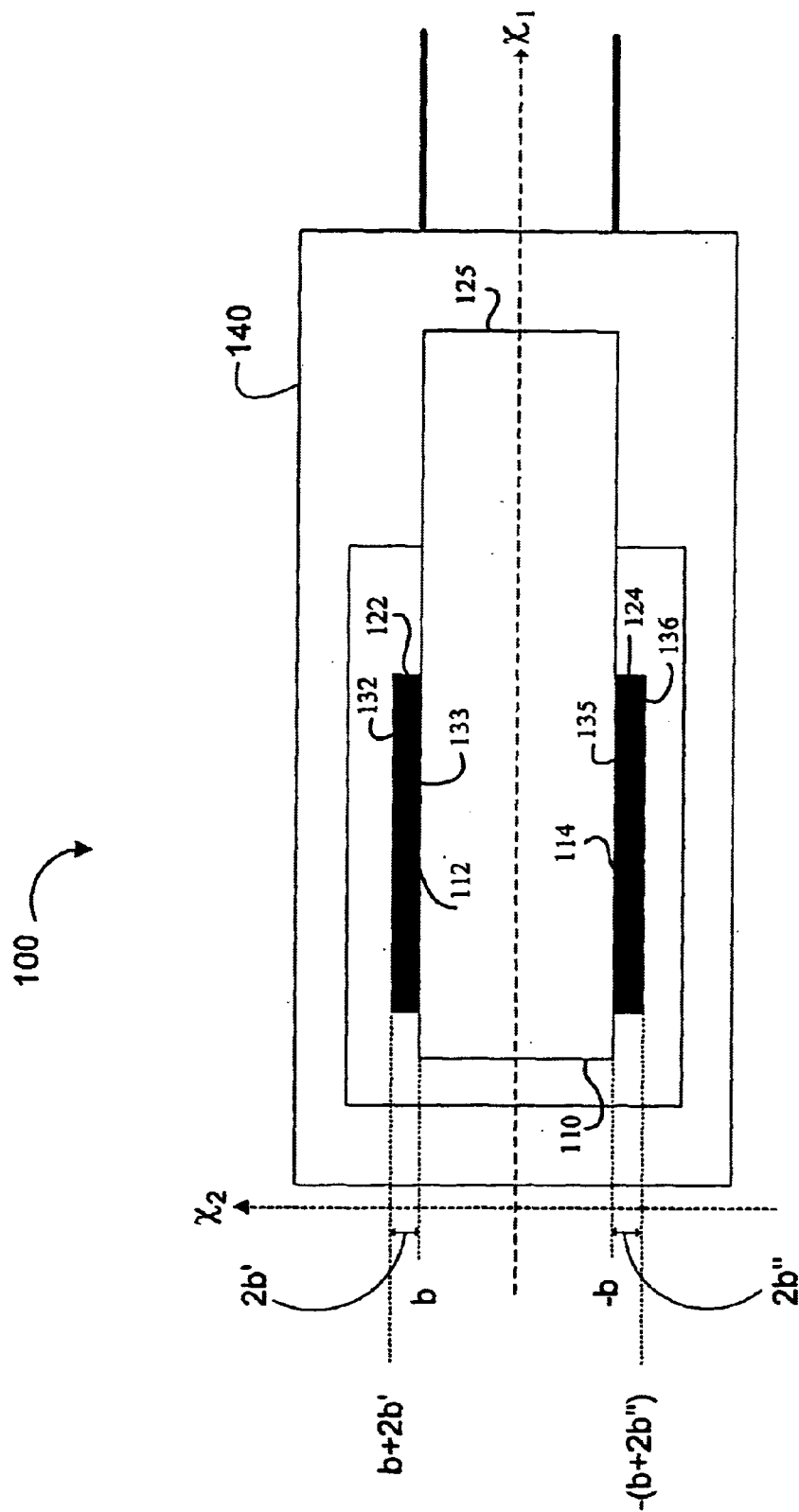
FIG. 1 is a cross-sectional view of a piezoelectric device having two electrodes affixed to opposite faces of a layer of piezoelectric material.

Referring now to FIG. 1, a cross-sectional view of a piezoelectric device 100 is shown relative to an $x_1$, $x_2$, $x_3$ coordinate system where the $x_3$ dimension extends perpendicular to the drawing sheet. The piezoelectric device 100 includes a layer of piezoelectric material 110 affixed to a pair of electrodes 122 and 124. More particularly, the layer of piezoelectric material 110 has a plate configuration defined by top and bottom faces 112 and 114 respectively and an outer edge 125. Electrode 122 has top and bottom faces 132 and 133 respectively, and electrode 124 has top and bottom faces 135 and 136 respectively. The bottom face 133 of electrode 122 is affixed to the top face 112 of piezoelectric plate 110, and the top face 135 of electrode 124 is affixed to the bottom face 114 of piezoelectric plate 110. The electrodes 122 and 124 may be formed in conventional manner, such as by deposition of thin layers of conductive material on the top and bottom faces 112 and 114 of the piezoelectric plate 110. Typically, the thickness 2b' and 2b" of the electrodes 122 and 124 respectively does not exceed about two percent of the total thickness 2(b+b'+b") of the piezoelectric device 110. For protective purposes, the piezoelectric device 100 generally is mounted in a sealing case 140. This may be achieved, for example, by bonding or welding the layer of piezoelectric material 110 to the sealing case 140.

In operation, the electrodes 122 and 124 and the piezoelectric plate 110 vibrate in unison in response to an electrical potential applied across the electrodes 122 and 124. The vibration induces an electrical oscillation across the electrodes 122 and 124. The electrical oscillation is highly stable and may beneficially be used, for example, as a frequency generator, or for timing or clocking other devices. In accordance with the present invention, the design for piezoelectric device 100 is verified to assure that the piezoelectric device 100 will operate properly.

Figure 2:
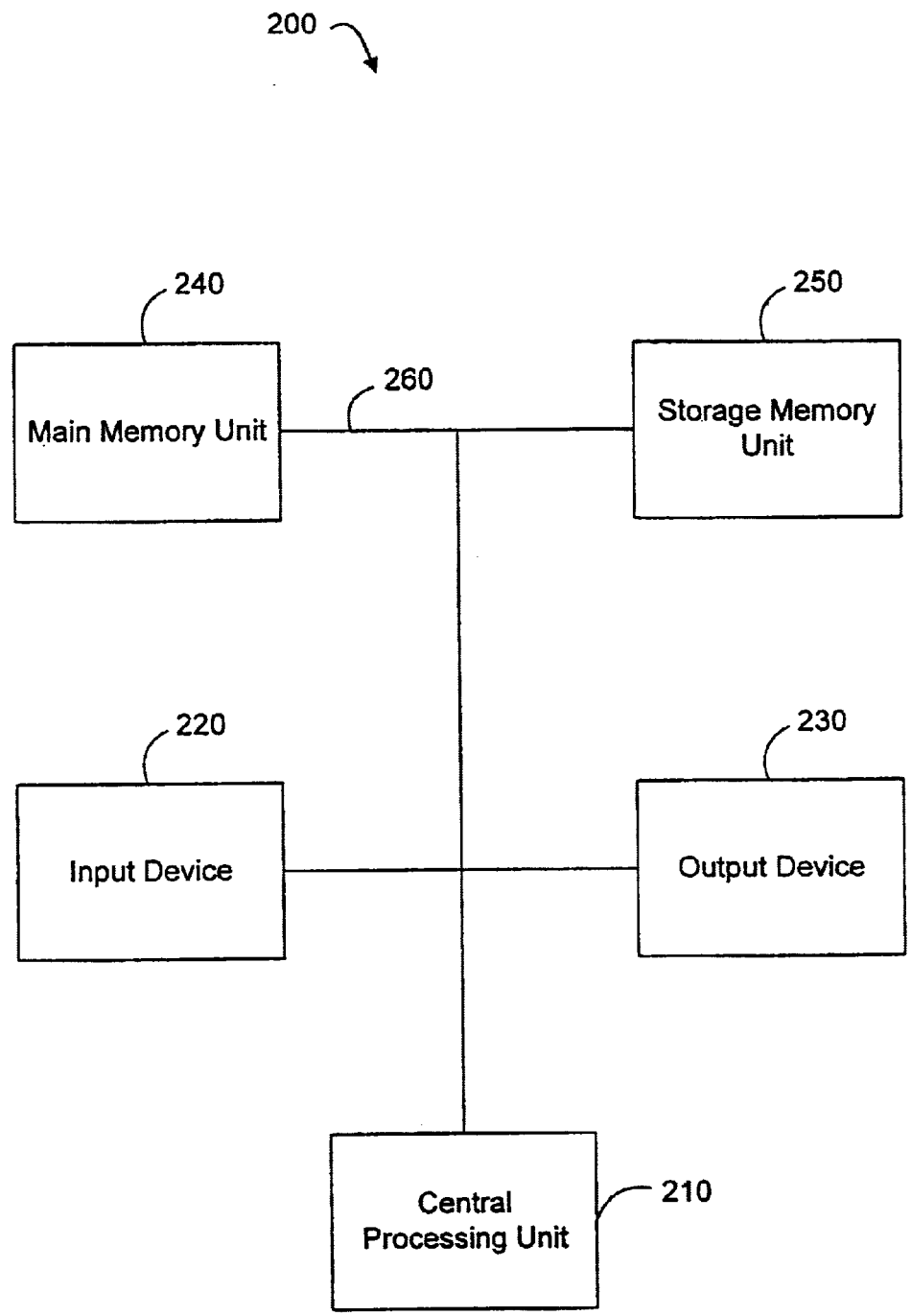
FIG. 2 is a functional block diagram of a computer-implemented system for carrying out various aspects of the method for verifying the design of a piezoelectric device according to the present invention.

Referring now to FIG. 2, there is shown a functional block diagram of an embodiment of a computer-implemented system 200 suitable for carrying out the design-based analysis of the present invention, including the vibration frequency analysis of the piezoelectric plate 110. The computer-implemented system 200 includes a central processing unit (CPU) 210, an input device 220, an output device 230, a main memory unit 240, a storage memory unit 250, and a multi-bit bus 260.

Hardware components of the computer implemented system 200 beneficially may have a variety of designs. For example, the CPU 210 can be a microprocessor of any suitable type such as those commercially available from Intel Corporation of Santa Clara, Calif., or from Apple Computer, Inc. of Cupertino, Calif. The CPU 210 provides computing resources and preferably includes a floating-point math coprocessor to increase performance speed on various calculations performed in accordance with the method of the present invention. The input device 220 can be any suitable device for supplying information to the CPU 210, such as a conventional keyboard or mouse. The output device 230 can be, for example, a conventional cathode ray tube (CRT) monitor or a printer. The main and storage memory units 240 and 250 are machine readable media capable of being read by the CPU 210, and may be of conventional design. For example, the main memory unit 240 can be a dynamic random access memory unit (DRAM) or a static random access memory unit (SRAM). The storage memory unit 250 can be a storage medium such as a conventional hard disk and corresponding drive. Storage memory unit 250 can also be a magnetic tape, magnetic disk or an optical medium and corresponding drive, specific examples of which include a compact disk (CD) and corresponding drive and a digital versatile disk (DVD) and corresponding drive. The storage memory unit 250 may be used to store a program of instructions which are capable of directing the CPU 210 to perform the vibration frequency analysis method in accordance with the present invention. The multi-bit bus 260 can be of conventional design. Interconnection of hardware components of the computer-implemented system 200 by multi-bit bus 260 is achieved in a conventional manner.

In operation, a user inputs the relevant parameters of the piezoelectric plate 110 under consideration into the computer implemented system 200 via the input device 220. In response to such input from the user, the CPU 210 reads the storage memory unit 250 via the bus 260 and main memory unit 240 to obtain the program of instructions. In response to the program of instructions and the input from the user, the CPU 210 performs an embodiment of the vibration frequency analysis of the piezoelectric plate 110 in accordance with the present invention.

The manner in which the correction factors are developed and the application of such correction factors to a model of the piezoelectric plate 110, such as a vibration frequency model, to determine certain important properties of the plate 110 will now be described.

1. Introduction

As previously noted, the correction factors of the present invention have been developed and determined using certain modeling equations. These modeling equations are developed in accordance with the Mindlin plate theory. This theory is based upon the power series expansion of displacement and has been extensively applied in the high frequency vibration analysis of crystal plates of resonators.

Earlier analytical efforts concentrated on truncated equations, usually with only the coupling of the thickness and flexural modes, for infinite strips. These simpler equations and models have been useful in obtaining solutions which are important in the design and analysis of piezoelectric devices.

More recently, the finite element method (FEM) has been applied for a more accurate analysis of crystal plates. These implementations enable not only rigorous study of the two-dimensional problem but also in-depth examination of the third- or even higher-order plate theory which is typically required for precise frequency and mode shape computations. For example, devices vibrating in higher-order overtones of the fundamental thickness-shear frequency may require such higher-order plate theory for analysis. It has been found that the third-order plate theory gives an accurate prediction of the coupled thickness-shear and flexural vibration frequencies. However, higher-order theory has not been thoroughly studied in the past due to the difficulties in obtaining closed form solutions even for straight-crested waves for plates of very simple configurations. As a result, the accuracy with which these theories are able to determine the elastic characteristics of a piezoelectric material, even dispersion characteristics and cut-off frequencies, has not previously been examined in sufficient detail to confidently apply the theories to vibrational problems.

Although traditional solution techniques for frequency vibration problems have been demonstrated by Mindlin throughout his work, the inventors herein have found that some changes in the form of correction factors are required to improve the accuracy of the solutions and hence the analysis of piezoelectric plates. For the first-order Mindlin plate theory, the correction is essential. For the third- and higher-order plate theory, the correction improves the accuracy of the thickness-shear vibration solutions, although some of the third-order solutions are nearly exact even without the correction. Moreover, the inventors herein have found that for piezoelectric plates with larger aspect ratios the accuracy of the solutions in both the frequency and displacement analysis are significantly improved with the introduction of correction factors. The aspect ratio of a piezoelectric plate is its length divided by its width which in the illustrated embodiment is the length or diameter of piezoelectric plate 110 measured in the $x_1$ direction divided by 2b.

The inventors' development of these correction factors in accordance with the Mindlin plate theory is demonstrated below. Their development begins with a study of the cut-off frequencies of the coupled thickness-shear and extensional straight-crested waves and a comparison to the exact solutions. Next, the inventors' demonstrate their developed method for correcting the third-order plate theory to make the cut-off frequencies exact and further show how their method can be extended to higher-order plate theories. In developing the correction factors, the inventors have found that there is more than one way to insert the correction factors. Thus, the equations have been corrected with a symmetric approach as well as an asymmetric approach. The procedures for these two approaches are different only in the way that the correction factors are inserted into the equations. However, which set of equations are used (i.e., symmetric or asymmetric) will depend on the particular application. In particular, the asymmetric equations will be more convenient for analytical applications, but for the finite element applications, only the symmetrically corrected equations can be used. Although these correction factors have particular application in analyzing vibration frequency characteristics in a piezoelectric plate, they may also be used for other plate vibration problems.

2. Fundamentals of the Mindlin Higher-Order Plate Theory

A compact version of the higher-order plate theory which focuses on the accuracy and correction aspects of the theory is discussed below. As previously noted, the basic equations of higher order Mindlin plate theory are based upon the power series expansion of displacement in the direction of the thickness coordinate $x_2$ as shown in equation (1) which is set forth in the Appendix along with the other numbered equations referenced in the following discussion. The configuration of the piezoelectric plate 110 is shown in FIG. 1. The strain tensor, based on the theory of three-dimensional elasticity, is set forth in equation (2) with the $n^{th}$-order strain components defined in equation (3).

The constitutive relations for a plate 110 of uniform thickness must be defined from the weighted integration over the thickness of the plate 110 since the variational equations of motion are defined that way. The $n^{th}$-order stress in two-dimensional variables only is given by equation (4). Note that the higher-order strains are coupled through the integrations constant $B_{mn}$ as shown in equation (5).

The two-dimensional stress equations of motion are set forth in equation (6), where $\rho$ is the density of the piezoelectric plate 110. It should be noted that the tractions on the two faces 112 and 114 have been incorporated into the equations of motion through $F_j^{(n)}$. This is an important feature because now the boundary conditions are restricted on the cylindrical edges only, as will be discussed below. The inertia terms are also coupled through the integration constants $B_{mn}$.

With the displacement, strain, and stress given in equations (1), (3), and (4) respectively, the kinetic and strain energy densities through the integration over the thickness of the uniform plate 110 are set forth in equation (7). Again, the higher-order displacements and strains are coupled through the integrations constant $B_{mn}$.

2.1 Boundary Conditions

With the prescribed stress or displacement denoted in barred variables, the boundary conditions related to the higher-order plate theory are described in equations (8), (9) and (10).

3. Cut-Off Frequencies of the Higher-Order Plate Theory

Examination of the higher-order Mindlin plate theory begins with the two-dimensional equations identified in the previous section. For simplicity, the tensor equations are expanded to obtain the field equations in displacements. These field equations, with the necessary truncations, are used to study the dispersion characteristics of an infinite plate, that is, a piezoelectric plate infinite in the $x_1$ dimension, as was previously done by Mindlin. The accuracy of the dispersion relation in comparison with the three-dimensional solutions ultimately determines whether correction procedures are needed. The examination of the dispersion relation includes checking the slope and curvature of the curve and the cut-off frequencies. However, the frequency values at wave number zero are examined first. Only after the cut-off frequencies are correctly obtained can the curve be corrected to yield solutions close to the exact solutions in a given frequency range.

The strain components from equation (3) in abbreviated notation are set forth in equation (11). Note that the strain components are grouped by indices. As will be seen later, the higher-order displacements are associated with the even indices. Later, it will also be seen that it is due to these terms that the stress is corrected through the strain. The constitutive equations in (4) can be rewritten in abbreviated notation as set forth in equation (12). With the strain components in equation (11), the constitutive equation in displacement components is given in equation (13). Similarly, the stress equations of motion for traction-free plates that have $F_j^{(n)}=0$ are set forth in equation (14). Substituting the stress components in equation (14) with those in equation (4) yields displacement equations of motion of the $n^{th}$-order.

As is well known, the dispersion characteristics of equations (11) through (14), particularly the first-order equations involving $u_n^{(n)}$ (j=1,2,3;n=0,1), have been thoroughly examined and discussed by Mindlin. These studies also paved the way for the derivation and correction of the plate theory for the thickness-shear vibrations of piezoelectric plates.

Starting where Mindlin left off, the inventors have extended the analysis to higher-order plate theory, particularly the third-order theory which is important in the study of crystal plate vibrations. In particular, the inventors have developed corrections for the higher-order plate theory.

Starting with straight-crested waves in the $x_1$ direction, the stress-displacement equation for one spatial variable can be further reduced as shown in equation (15). Similarly, the stress equations of motion for straight-crested waves in the $x_1$ direction are as set forth in equation (16).

For further study of vibrations with higher-order modes, equations (15) and (16) are expanded up to the third-order displacement components as stated in equations (17) and (18). From equation (18) it will be seen that the inertia terms of the thickness-shear modes $u_j^{(k)}$ (j=1,2,3;k=1,3) and extensional modes $u_j^{(k)}$ (j=1,2,3;k=0,2) are coupled separately through corresponding stresses. This implies that it may be possible to study the thickness-shear vibrations coupled with the extensional modes, depending on the material which will undergo the stresses in equation (17). The description herein is primarily directed to an AT-cut quartz crystal, a popular material for crystal resonators and sensors.

In considering the dispersion characteristics at the cut-off frequencies or the vibration frequencies at wave number zero, equation (17) can be further simplified by dropping terms with derivatives. For an AT-cut quartz crystal with the following material constants measured in N/m$^2$:

$c_{11}$=86.74×10$^9$, $c_{22}$=129.77×10$^9$, $c_{33}$=102.83×10$^9$, $c_{12}$=-8.25×10$^9$, $c_{13}$=27.15×10$^9$, $c_{14}$=-3.66×10$^9$, $c_{23}$=-7.42×10$^9$, $c_{24}$=5.7×10$^9$, $c_{34}$=9.92×10$^9$, $c_{44}$=38.61×10$^9$, $c_{55}$=68.81×10$^9$, $c_{66}$=29.01×10$^9$, $c_{56}$=2.53×10$^9$ the stress components related to vibrations in the $x_1$ direction are provided in equation (19).

By inserting equation (19) into the equations of motion for the straight-crested waves set forth in equation (18), the four vibration modes can be separated into the thickness-shear vibration group as shown in equation (20) and into the extensional vibration group as shown in equation (21).

Now, with the displacements defined as per equation (22) and the dimensionless frequency $\Omega$ as provided in equation (23), the two groups of equations in (20) and (21) can be written as set forth in equations (24) and (25).

These frequency equations in (24) and (25) are used to examine the accuracy of the cut-off frequency. For the first-order equation, the third-order overtone displacement amplitude in the $x_1$ direction $A_1^{(3)}$ is set to zero, thus obtaining the fundamental thickness-shear frequency as: $\Omega^2$=3. This is consistent with the solution obtained by Mindlin and also shows that the Mindlin plate theory needs correction to yield exact frequency solutions. The exact solution of the fundamental thickness-shear frequency is:

$$\Omega_1 = \frac{\pi^2}{4} = 2.46740110.$$

For the third-order theory, the frequency equation can be obtained through the diminishing of the determinant in equation (24) as shown in equation (26).

Solving equation (26) the two frequency solutions are: $\Omega^2$=2.46877438, 42.53122562. As can be observed, the first frequency solution is very close to the fundamental thickness-shear vibration frequency. In fact, the difference is less than 0.06%. This confirms the finding by Yong et al. that the third-order Mindlin plate theory is accurate for the fundamental thickness-shear frequency. The second solution is quite different from the exact frequency which is:

$$\Omega_3^2 = \frac{9\pi^2}{4} = 22.20660990.$$

Following the same procedure, for the coupled $u_j^{(n)}$ (j =2,3; n =1,3), that is, the thickness-twist and thickness-stretch modes in the $x_2$ and $x_3$ directions, equation (27) is obtained, where $A_2^{(n)}$ and $A_2^{(n)}$ are the $n^{th}$-order displacement amplitudes in the $x_2$ and $x_3$ directions respectively. The frequency solutions are expressed in terms of the square of the vibration frequency ($\omega^2$) and density ($\rho$). The solutions from the first-order theory are: $\omega^2\rho$=114.76492898, 390.37507102 while the exact frequencies are: $\omega^2\rho$= 94.39037068, 321.07062659. For the third-order theory, the frequency solutions are: $\omega^2\rho$=94.64377686, 320.55847369, 1641.98898492, 5519.90876454, with the first two solutions again being very close to the exact solutions.

For the fifth-order theory, the thickness-shear vibrations (in the $x_1$ direction) are given by equation (28). The three frequency solutions are: $\Omega^2$=2.46740175, 22.80636378, 184.72623446. The fifth-order theory gives the exact solution of the fundamental thickness-shear frequency while the third overtone is only about 3% higher.

4. Correction Factors: Natural Approach

Correction of the first-order plate theory had been studied and explained by Mindlin. The essence of the concept is to correct the inaccuracy of the cut-off frequencies and thereby obtain exact cut-off frequencies of infinite plates when the wave number approaches zero.

For example, consider the first-order plate theory for the fundamental thickness-shear vibrations. To obtain the exact frequency when the wave number approaches zero, a correction factor $\alpha=\kappa_6^{(0)}$ for the strain $S_6^{(0)}$ is introduced. This correction is considered through the adjustment of the strain energy density of the thickness-shear and flexural vibrations.

As a result, the frequency equation of the first-order plate upon correction is:

$$\alpha^2 - \frac{\Omega^2}{3} = 0.$$

Given the exact frequency $\Omega = \Omega_1$ yields the correction factor $$\alpha^2 = \frac{\pi^2}{12}.$$

For the coupled $u_2^{(1)}$ and $u_3^{(1)}$ the frequency equation is as stated in equation (29). By inserting the correction factor $$\alpha^2 = \frac{\pi^3}{12}$$

in equation (30) for $S_2^{(0)}$ and $S_4^{(0)}$ or letting $\kappa_2^{(0)} = \kappa_4^{(0)} = \alpha$, the exact solution is: $\omega^2 \rho = 94.39037068, 321.07062659$.

It can also be easily verified that the exact vibration frequencies of the thickness-shear modes in the $x_2$ and $x_3$ directions can be obtained with the same factor on the strain components $S_2^{(0)}$ and $S_4^{(0)}$. This correction, as Mindlin put it, gives equations (30) and (31).

Turning now to the third-order plate theory, although it is quite accurate for the fundamental thickness-shear vibration frequency, the inventors herein have found that the small inaccuracy that remains can be eliminated through the introduction of correction factors, as is the case with the first-order theory. Such correction factors can also adjust the third- and higher-order overtones to the exact solutions. Thus, in accordance with the present invention, the stress components are corrected with correction factors $\alpha^2$ and $\beta^2$ for the strain components $S_6^{(0)}$ and $S_6^2$, respectively. The stress equations in equation (19) are now written as set forth in equation (32). The resulting frequency equation with correction factors is set forth in equation (33). To yield exact solutions requires that $\alpha$ and $\beta$ be as set forth in equation (34); that is, that equation (34) be solved for $\alpha$ and $\beta$. Note that $\alpha^2$ is actually very close to the first-order correction factor which is not surprising in view of the fact that the fundamental thickness-shear frequency is almost exact from the third-order theory. It can be verified that after the correction factors $\alpha^2$ and $\beta^2$ are introduced the frequency solutions are exact. For the coupled vibrations of $u_2^{(1)}$ and $u_3^{(1)}$, equation (34) is obtained. It can also be verified that the exact frequencies are obtained upon correction. By extending the correction procedure to the stress terms in a similar manner, the effect of the correction factors can be observed through equation (35). All the correction factors related to the strain component and its order are set forth in equation (36).

In accordance with the invention, the correction procedure can be further extended to higher-orders assuming there is no technical difficulty in solving the algebraic equations resulting from the frequency equation. For the fifth-order theory, equation (37) is obtained. Generally, correction through the $n^{th}$-order stress components is provided in equation (38).

5. Correction factors: Symmetric Approach

The correction procedure developed based on the natural approach cannot be used in the FEM due to the resulting asymmetric modification of the material constant matrix by the correction factors. To overcome this limitation, the inventors use another set of correction factors for symmetric modification. A close examination of the constitutive relation from its derivation from the strain energy reveals that for stress the effect of correction of the strain in the same order must be considered. In other words, the effect of the strain terms due to the correction factors in the energy density function should be included.

Since the stress in equation (12) is actually related to both $S_p^{(n)}$ and $S_q^{(m)}$, correction factors of both of these strain components are added to the constitutive relation symmetrically as shown in equation (39).

As in the previous correction, consider $\alpha = \kappa_6^{(0)}$ and $\beta = \kappa_6^{(2)}$ to obtain equation (40), with the resulting frequency equation set forth in equation (41). The correction factors are $\alpha = 0.94763989$ and $\beta = 0.76229492$.

For the coupled thickness-shear vibrations in the $x_2$ and $x_3$ directions, the symmetric correction factors $\alpha = \kappa_2^{(0)} = \kappa_4^{(0)}$ and $\beta = \kappa_2^{(2)} = \kappa_4^{(2)}$ change the equations to those in equation (42). It can be verified that the solution from the $u_1^{(1)}$ in equation (41) also gives the exact frequencies. For the fifth-order theory, the symmetric correction factors can be introduced as $\alpha = \kappa_6^{(2)}$, $\beta = \kappa_6^{(2)} = \delta = \kappa_6^{(4)}$, with the resulting frequency equation as set forth in equation (43). These correction factors are: $\alpha = 0.96316000$, $\beta = 0.82742729$, $\delta = 0.71550120$.

Figure 3:
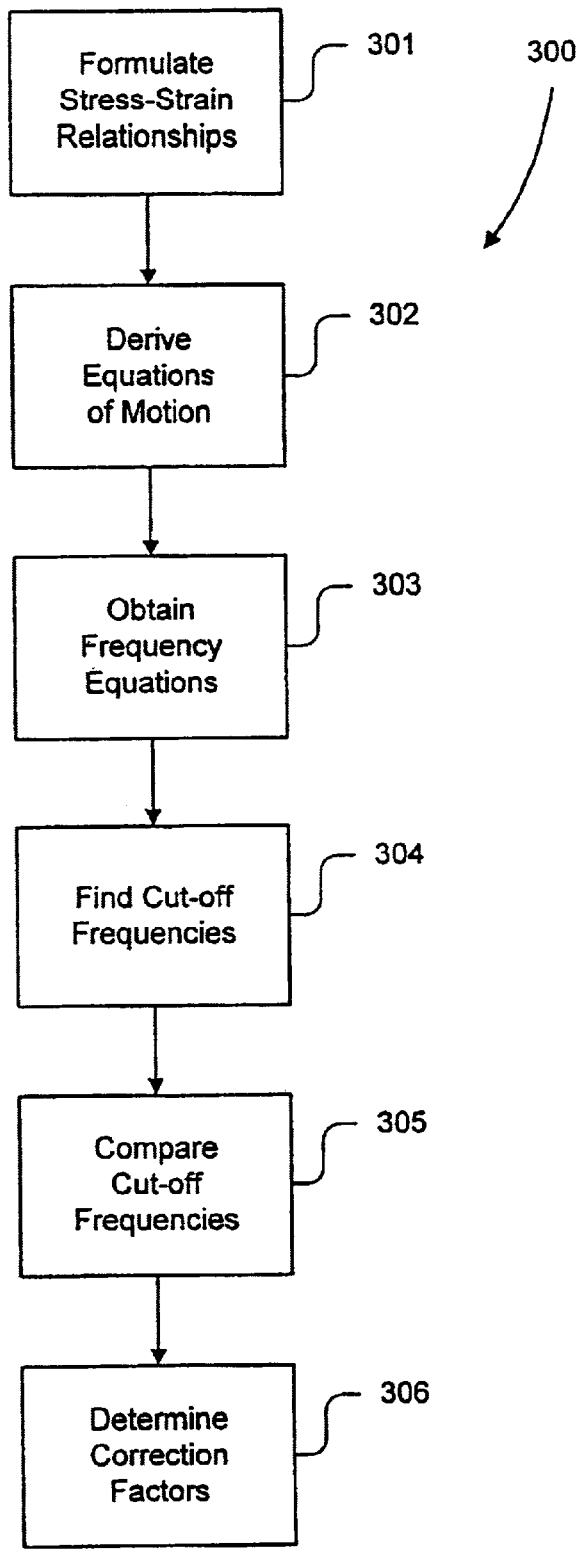
FIG. 3 is a flowchart illustrating a method for developing correction factors to be used in the analysis and design of a piezoelectric device, according to embodiments of the present invention.

The development of the correction factors described in detail above is summarized in the flow chart of FIG. 3 which depicts a method 300 for developing the correction factors according to embodiments of the invention. In step 301, stress-strain relationships are formulated for the piezoelectric plate 110. From the stress-strain relationships, equations of motion are derived in step 302. Based on the relationships and equations obtained in steps 301 and 302, frequency equations are developed in step 303. Using these frequency equations, certain cut-off frequencies are determined in step 304. These solutions are then compared with the known exact solutions for an infinite plate in step 305. Based on the comparison, the correction factors are determined in step 306.

Figure 4:
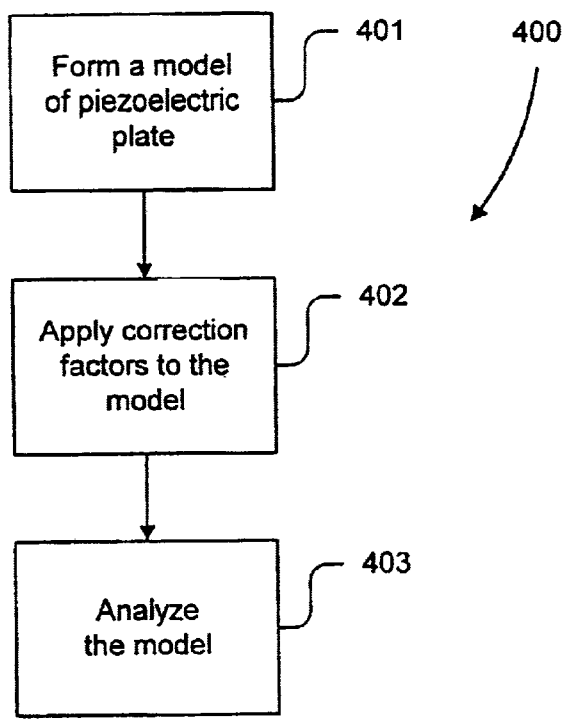
FIG. 4 is a flowchart illustrating a method for analyzing a model of a piezoelectric material to verify the design of a piezoelectric device, according to embodiments of the present invention.

In accordance with the invention, the developed correction factors may be advantageously used in the design of the piezoelectric device 100. FIG. 4 is a flow chart illustrating a method 400 of applying the correction factors to analyze or verify the design of device 100. In step 401, a model of the piezoelectric plate 110 is formed. This model is preferably a vibration frequency model of the plate 110. In step 402, correction factors are applied to the model. The model is then analyzed in step 403 to determine certain important properties of the piezoelectric plate 110 such as its vibration frequency characteristics. For example, the model may be analyzed to determine the fundamental thickness-shear frequency characteristics of the plate 110 or to determine the coupling of its thickness-shear vibration mode with other vibration modes such as the flexural vibration mode. Such analysis may further include verifying whether the plate 110—and hence the device 100—meets a design specification for the device 100.

As the foregoing description demonstrates, the designed-based analysis of a piezoelectric plate in accordance with the present invention significantly reduces post-production processing of the plate and the piezoelectric device in which the plate is to be embodied. The design-based analysis is particularly well suited to be implemented on a computer system such as computer system 200. However, the present invention is not so limited. In addition to using one or more program-controlled processors, the functions required to practice various aspects of the invention can also be implemented by functionally equivalent circuits such as discrete components, one or more application specific integrated circuits (ASICs), digital processing circuits, and the like, or combination thereof. Moreover, when software is used to implement various aspects of the invention, such software may be conveyed by a variety of machine-readable medium. Such medium include magnetic tape, magnetic disk and optical disc as well as baseband or modulated communication paths throughout the spectrum including from supersonic to ultraviolet frequencies.

While the invention has been described in conjunction with several specific embodiments, it will be evident to those skilled in the art in light of the foregoing description that many further alternatives, modifications and variations are possible. Thus, the invention described herein is intended to embrace all such alternatives, modifications, and variations as may fall within the spirit and scope of the appended claims.

APPENDIX $$u_j(x_1, x_2, x_3) = \sum_{n=0} u_j^{(n)}(x_1, x_3, t) x_2^n, \quad j = 1, 2, 3, \tag{1}$$

where $u_j$, $u_j^{(n)}$, and $t$ are displacement, nth-order displacement components, and time, respectively.

$$S_{ij} = \sum_{n=0} S_{ij}^{(n)} x_2^n, \quad i, j = 1, 2, 3, \tag{2}$$

with the nth-order strain components defined as $$S_{ij}^{(n)} = \frac{1}{2}[u_{i,j}^{(n)} + u_{j,i}^{(n)} + (n+1)(\delta_{i2} u_j^{(n+1)} + \delta_{j2} u_i^{(n+1)})]. \tag{3}$$

$$T_{ij}^{(n)} = \int_{-b}^{b} T_{ij} x_2^n \, dx_2 = \sum_m B_{mn} c_{ijkl} S_{kl}^{(m)}, \tag{4}$$

where $c_{ijkl}$ is the elastic constants of material.

$$B_{mn} = \begin{cases} \dfrac{2b^{m+n+1}}{m+n+1}, & m+n = \text{even} \\ 0, & m+n = \text{odd}. \end{cases} \tag{5}$$

$$T_{ij,i}^{(n)} - n T_{2j}^{(n-1)} + F_j^{(n)} = \rho \sum_m B_{mn} \ddot{u}_j^{(m)}, \tag{6}$$

$$F_j^{(n)} = b^n [T_{2j}(b) - (-1)^n T_{2j}(-b)].$$

$$\overline{K} = \frac{1}{2} \rho \sum_m \sum_n B_{mn} \dot{u}_j^{(m)} \dot{u}_j^{(n)}, \tag{7}$$

$$\overline{H} = \frac{1}{2} \sum_m \sum_n B_{mn} c_{ijkl} S_{ij}^{(m)} S_{kl}^{(n)}.$$

$$T_{2j} = \bar{t}_j \quad \text{on} \quad A(x_2 = \pm b), \tag{8}$$

$$T_p^{(n)} = \bar{t}_p^{(n)} \quad \text{on} \quad C,$$

where $$\bar{t}_p^{(n)} = \int_{-b}^{b} \bar{t}_p x_2^n \, dx_2. \tag{9}$$

or alternatively $$u_i = \bar{u}_i, \text{ on } A(x_2 = \pm b)$$

$$u_j^{(n)} = \bar{u}_j^{(n)} \text{ on } C. \tag{10}$$

$$S_1^{(n)} = u_{1,1}^{(n)},\ S_3^{(n)} = u_{3,3}^{(n)},\ S_5^{(n)} = u_{3,1}^{(n)} + u_{1,3}^{(n)},$$

$$S_2^{(n)} = (n+1) u_2^{(n+1)},\ S_4^{(n)} = u_{2,3}^{(n)} + (n+1) u_3^{(n+1)},\ S_6^{(n)} = u_{2,1}^{(n)} + (n+1) u_1^{(n+1)}. \tag{11}$$

$$T_p^{(n)} = \frac{\partial \overline{H}}{\partial S_p^{(n)}} = \sum_{m=0} B_{mn} c_{pq} S_q^{(m)}, \quad p, q = 1, 2, 3, 4, 5, 6. \tag{12}$$

$$T_p^{(n)} = \sum_{m=0} B_{mn} \{ c_{p1} u_{1,1}^{(m)} + c_{p2}(m+1) u_2^{(m+1)} + c_{p3} u_{3,3}^{(m)} + c_{p4}[u_{2,3}^{(m)} + (m+1) u_3^{(m+1)}] + c_{p5}(u_{1,3}^{(m)} + u_{3,1}^{(m)}) + c_{p6}[u_{2,1}^{(m)} + (m+1) u_1^{(m+1)}] \}. \tag{13}$$

$$\begin{Bmatrix} T_{1,1}^{(n)} \\ T_{6,1}^{(n)} \\ T_{5,1}^{(n)} \end{Bmatrix} + \begin{Bmatrix} T_{5,3}^{(n)} \\ T_{4,3}^{(n)} \\ T_{3,3}^{(n)} \end{Bmatrix} - n \begin{Bmatrix} T_6^{(n-1)} \\ T_2^{(n-1)} \\ T_4^{(n-1)} \end{Bmatrix} = \sum_{m=0} B_{mn} \rho \begin{Bmatrix} \ddot{u}_1^{(m)} \\ \ddot{u}_2^{(m)} \\ \ddot{u}_3^{(m)} \end{Bmatrix}. \tag{14}$$

$$T_p^{(n)} = \sum_{m=0} B_{mn} \{ c_{p1} u_{1,1}^{(m)} + c_{p2}(m+1) u_2^{(m+1)} + c_{p4}(m+1) u_3^{(m+1)} + c_{p5} u_{3,1}^{(m)} + c_{p6}[u_{2,1}^{(m)} + (m+1) u_1^{(m+1)}] \}. \tag{15}$$

$$\begin{Bmatrix} T_{1,1}^{(n)} \\ T_{6,1}^{(n)} \\ T_{5,1}^{(n)} \end{Bmatrix} - n \begin{Bmatrix} T_6^{(n-1)} \\ T_2^{(n-1)} \\ T_4^{(n-1)} \end{Bmatrix} = \sum_{m=0} B_{mn} \rho \begin{Bmatrix} \ddot{u}_1^{(m)} \\ \ddot{u}_2^{(m)} \\ \ddot{u}_3^{(m)} \end{Bmatrix}. \tag{16}$$

$$T_p^{(0)} = 2b\{c_{p1} u_{1,1}^{(0)} + c_{p2} u_2^{(1)} + c_{p4} u_3^{(1)} + c_{p5} u_{3,1}^{(0)} + c_{p6}[u_{2,1}^{(0)} + u_1^{(1)}]\} + \frac{2b^3}{3}\{c_{p1} u_{1,1}^{(2)} + 3 c_{p2} u_2^{(3)} + 3 c_{p4} u_3^{(3)} + c_{p5} u_{3,1}^{(2)} + c_{p6}[u_{2,1}^{(2)} + 3 u_1^{(3)}]\}, \tag{17}$$

$$T_p^{(1)} = \frac{2b^3}{3}\{c_{p1} u_{1,1}^{(1)} + 2 c_{p2} u_2^{(2)} + 2 c_{p4} u_3^{(2)} + c_{p5} u_{3,1}^{(1)} + c_{p6}[u_{2,1}^{(1)} + 2 u_1^{(2)}]\} + \frac{2b^5}{5}\{c_{p1} u_{1,1}^{(3)} + 4 c_{p2} u_2^{(4)} + 4 c_{p4} u_3^{(4)} + c_{p5} u_{3,1}^{(3)} + c_{p6}[u_{2,1}^{(3)} + 4 u_1^{(4)}]\},$$

$$T_p^{(2)} = \frac{2b^3}{3}\{c_{p1} u_{1,1}^{(0)} + c_{p2} u_2^{(1)} + c_{p4} u_3^{(1)} + c_{p5} u_{3,1}^{(0)} + c_{p6}[u_{2,1}^{(0)} + u_1^{(1)}]\} + \frac{2b^5}{5}\{c_{p1} u_{1,1}^{(2)} + 3 c_{p2} u_2^{(3)} + 3 c_{p4} u_3^{(3)} + c_{p5} u_{3,1}^{(2)} + c_{p6}[u_{2,1}^{(2)} + 3 u_1^{(3)}]\},$$

$$T_p^{(3)} = \frac{2b^5}{5}\{c_{p1} u_{1,1}^{(1)} + 2 c_{p2} u_2^{(2)} + 2 c_{p4} u_3^{(2)} + c_{p5} u_{3,1}^{(1)} + c_{p6}[u_{2,1}^{(1)} + 2 u_1^{(2)}]\} + \frac{2b^7}{7}\{c_{p1} u_{1,1}^{(3)} + 4 c_{p2} u_2^{(4)} + 4 c_{p4} u_3^{(4)} + c_{p5} u_{3,1}^{(3)} + c_{p6}[u_{2,1}^{(3)} + 4 u_1^{(4)}]\},$$

and $$\begin{Bmatrix} T_{1,1}^{(0)} \\ T_{6,1}^{(0)} \\ T_{5,1}^{(0)} \end{Bmatrix} = 2b\rho \begin{Bmatrix} \ddot{u}_1^{(0)} \\ \ddot{u}_2^{(0)} \\ \ddot{u}_3^{(0)} \end{Bmatrix} + \frac{2b^3}{3}\rho \begin{Bmatrix} \ddot{u}_1^{(2)} \\ \ddot{u}_2^{(2)} \\ \ddot{u}_3^{(2)} \end{Bmatrix},$$

$$\begin{Bmatrix} T_{1,1}^{(1)} \\ T_{6,1}^{(1)} \\ T_{5,1}^{(1)} \end{Bmatrix} - \begin{Bmatrix} T_6^{(0)} \\ T_2^{(0)} \\ T_4^{(0)} \end{Bmatrix} = \frac{2b^3}{3}\rho \begin{Bmatrix} \ddot{u}_1^{(1)} \\ \ddot{u}_2^{(1)} \\ \ddot{u}_3^{(1)} \end{Bmatrix} + \frac{2b^5}{5}\rho \begin{Bmatrix} \ddot{u}_1^{(3)} \\ \ddot{u}_2^{(3)} \\ \ddot{u}_3^{(3)} \end{Bmatrix},$$

$$\begin{Bmatrix} T_{1,1}^{(2)} \\ T_{6,1}^{(2)} \\ T_{5,1}^{(2)} \end{Bmatrix} - 2\begin{Bmatrix} T_6^{(1)} \\ T_2^{(1)} \\ T_4^{(1)} \end{Bmatrix} = \frac{2b^3}{3}\rho \begin{Bmatrix} \ddot{u}_1^{(0)} \\ \ddot{u}_2^{(0)} \\ \ddot{u}_3^{(0)} \end{Bmatrix} + \frac{2b^5}{5}\rho \begin{Bmatrix} \ddot{u}_1^{(2)} \\ \ddot{u}_2^{(2)} \\ \ddot{u}_3^{(2)} \end{Bmatrix}, \tag{18}$$

$$\begin{Bmatrix} T_{1,1}^{(3)} \\ T_{6,1}^{(3)} \\ T_{5,1}^{(3)} \end{Bmatrix} - 3\begin{Bmatrix} T_6^{(2)} \\ T_2^{(2)} \\ T_4^{(2)} \end{Bmatrix} = \frac{2b^5}{5}\rho \begin{Bmatrix} \ddot{u}_1^{(1)} \\ \ddot{u}_2^{(1)} \\ \ddot{u}_3^{(1)} \end{Bmatrix} + \frac{2b^7}{7}\rho \begin{Bmatrix} \ddot{u}_1^{(3)} \\ \ddot{u}_2^{(3)} \\ \ddot{u}_3^{(3)} \end{Bmatrix}.$$

-continued $$T_6^{(0)} = 2bc_{66}u_1^{(1)} + 2b^3 c_{66}u_1^{(3)}, \tag{19}$$

$$T_6^{(1)} = \frac{4b^3}{3}c_{66}u_1^{(2)},$$

$$T_6^{(2)} = \frac{2b^3}{3}c_{66}u_1^{(1)} + \frac{6b^5}{5}c_{66}u_1^{(3)}.$$

$$-2bc_{66}u_1^{(1)} - \frac{4b^3}{3}c_{66}u_1^{(3)} = \frac{2b^3}{3}\rho\ddot{u}_1^{(1)} + \frac{2b^5}{5}\rho\ddot{u}_1^{(3)}, \tag{20}$$

$$-2b^3 c_{66}u_1^{(1)} - \frac{18b^5}{5}c_{66}u_1^{(3)} = \frac{2b^5}{5}\rho\ddot{u}_1^{(1)} + \frac{2b^7}{7}\rho\ddot{u}_1^{(3)},$$

$$2b\rho\ddot{u}_1^{(0)} + \frac{2b^3}{3}\rho\ddot{u}_1^{(2)} = 0, \tag{21}$$

$$-\frac{8b^3}{3}c_{66}u_1^{(2)} = \frac{2b^3}{3}\rho\ddot{u}_1^{(0)} + \frac{2b^5}{5}\rho\ddot{u}_1^{(2)}.$$

$$u_1^{(n)} = A_1^{(n)}e^{i\omega t}, \quad n = 0, 1, 2, 3. \tag{22}$$

$$\omega^2 \rho = \frac{c_{66}}{b^2}\Omega^2, \tag{23}$$

$$\left(1 - \frac{\Omega^2}{3}\right)A_1^{(1)} + b^2\left(1 - \frac{\Omega^2}{5}\right)A_1^{(3)} = 0, \tag{24}$$

$$\left(1 - \frac{\Omega^2}{5}\right)A_1^{(1)} + b^2\left(\frac{9}{5} - \frac{\Omega^2}{7}\right)A_1^{(3)} = 0,$$

$$\Omega^2 A_1^{(0)} + b^2\frac{\Omega^2}{3}A_1^{(2)} = 0, \tag{25}$$

$$-\frac{\Omega^2}{3}A_1^{(0)} + b^2\left(\frac{4}{3} - \frac{\Omega^2}{5}\right)A_1^{(2)} = 0.$$

$$\left(1 - \frac{\Omega^2}{3}\right)\left(\frac{9}{5} - \frac{\Omega^2}{7}\right) = \left(1 - \frac{\Omega^2}{5}\right)^2. \tag{26}$$

$$\left(c_{22} - \frac{b^2}{3}\omega^2\rho\right)A_2^{(1)} + c_{24}A_3^{(1)} + b^2\left(c_{22} - \frac{b^2}{5}\omega^2\rho\right)A_2^{(3)} + b^2 c_{24}A_3^{(3)} = 0, \tag{27}$$

$$c_{42}A_2^{(1)} + \left(c_{44} - \frac{b^2}{3}\omega^2\rho\right)A_3^{(1)} + b^2 c_{42}A_2^{(3)} + \left(c_{44} - \frac{b^2}{5}\omega^2\rho\right)A_3^{(3)} = 0,$$

$$\left(c_{22} - \frac{b^2}{5}\omega^2\rho\right)A_2^{(1)} + c_{24}A_3^{(1)} + b^2\left(\frac{9}{5}c_{22} - \frac{b^2}{7}\omega^2\rho\right)A_2^{(3)} + \frac{9b^2}{5}c_{22}A_3^{(3)} = 0,$$

$$c_{42}A_2^{(1)} + \left(c_{44} - \frac{b^2}{5}\omega^2\rho\right)A_3^{(1)} + \frac{9b^2}{5}c_{42}A_2^{(3)} + \left(\frac{9}{5}c_{44} - \frac{b^2}{7}\omega^2\rho\right)A_3^{(3)} = 0.$$

$$\left(1 - \frac{\Omega^2}{3}\right)A_1^{(1)} + b^2\left(1 - \frac{\Omega^2}{5}\right)A_1^{(3)} + b^4\left(1 - \frac{\Omega^2}{7}\right)A_1^{(5)} = 0, \tag{28}$$

$$\left(1 - \frac{\Omega^2}{5}\right)A_1^{(1)} + b^2\left(\frac{9}{5} - \frac{\Omega^2}{7}\right)A_1^{(3)} + b^4\left(\frac{15}{7} - \frac{\Omega^2}{9}\right)A_1^{(5)} = 0,$$

$$\left(1 - \frac{\Omega^2}{7}\right)A_1^{(1)} + b^2\left(\frac{15}{7} - \frac{\Omega^2}{9}\right)A_1^{(3)} + b^4\left(\frac{25}{9} - \frac{\Omega^2}{11}\right)A_1^{(5)} = 0.$$

$$\left(c_{22} - \frac{b^2}{3}\omega^2\rho\right)A_2^{(1)} + c_{24}A_3^{(1)} = 0, \tag{29}$$

$$c_{42}A_2^{(1)} + \left(c_{44} - \frac{b^2}{3}\omega^2\rho\right)A_3^{(1)} = 0.$$

$$T_p^{(0)} = c_{pq}\kappa_p\kappa_q S_q^{(0)}, \tag{30}$$

with $$\kappa_q^2 = \begin{cases} \frac{\pi^2}{12}, & q = 2, 4, 6, \\ 1.0, & p, q = 1, 3, 5. \end{cases} \tag{31}$$

$$T_6^{(0)} = 2bc_{66}\alpha^2 u_1^{(1)} + 2b^3 c_{66}\beta^2 u_1^{(3)}, \tag{32}$$

$$T_6^{(2)} = \frac{2b^3}{3}c_{66}\alpha^2 u_1^{(1)} + \frac{6b^5}{5}c_{66}\beta^2 u_1^{(3)}.$$

$$\left(\alpha - \frac{\Omega^2}{3}\right)\left(\frac{9}{5}\beta^2 - \frac{\Omega^2}{7}\right) = \left(\alpha^2 - \frac{\Omega^2}{5}\right)\left(\beta^2 - \frac{\Omega^2}{5}\right). \tag{33}$$

$$\left(\alpha^2 c_{22} - \frac{b^2}{3}\omega^2\rho\right)A_2^{(1)} + \alpha^2 c_{24}A_3^{(1)} + b^2\left(\beta^2 c_{22} - \frac{b^2}{5}\omega^2\rho\right)A_2^{(3)} + b^2\beta^2 c_{24}A_3^{(3)} = 0, \tag{34}$$

$$\alpha^2 c_{42}A_2^{(1)} + \left(\alpha^2 c_{44} - \frac{b^2}{3}\omega^2\rho\right)A_3^{(1)} + b^2\beta^2 c_{42}A_2^{(3)} + \left(\beta^2 c_{44} - \frac{b^2}{5}\omega^2\rho\right)A_3^{(3)} = 0,$$

$$\left(\alpha^2 c_{22} - \frac{b^2}{5}\omega^2\rho\right)A_2^{(1)} + \alpha^2 c_{24}A_3^{(1)} + b^2\left(\beta^2 c_{22} - \frac{b^2}{7}\omega^2\rho\right)A_2^{(3)} + \frac{9b^2}{5}\beta^2 c_{22}A_3^{(3)} = 0,$$

$$\alpha^2 c_{42}A_2^{(1)} + \left(\alpha^2 c_{44} - \frac{b^2}{5}\omega^2\rho\right)A_3^{(1)} + b^2\beta^2\frac{9b^2}{5}c_{42}A_2^{(3)} + \left(\frac{9}{5}\beta^2 c_{44} - \frac{b^2}{7}\omega^2\rho\right)A_3^{(3)} = 0.$$

$$T_p^{(n)} = \sum_{m=0}^{N} B_{mn}\kappa_p^{(m)}\{c_{p1}u_{1,1}^{(m)} + c_{p2}\kappa_2^{(2)}(m+1)u_2^{(m+1)} + c_{p3}u_{3,3}^{(m)} + c_{p4}\kappa_4^{(m)}[u_{2,3}^{(m)} + (m+1)u_3^{(m+1)}] + c_{p5}(u_{1,3}^{(m)} + u_{3,1}^{(m)}) + c_{p6}\kappa_6^{(m)}[u_{2,1}^{(m)} + (m+1)u_1^{(m+1)}]\}. \tag{35}$$

$$\kappa_q^{(0)} = \begin{cases} \frac{\pi}{\sqrt{12}}\sqrt{\frac{1}{5}(\sqrt{235} - 10)}, & q = 2, 4, 6, \\ 1.0, & p, q = 1, 3, 5. \end{cases} \tag{36}$$

$$\kappa_q^{(1)} = \kappa_q^{(3)} = 1,$$

$$\kappa_q^{(2)} = \begin{cases} \frac{\pi}{\sqrt{12}}\sqrt{\frac{1}{35}(\sqrt{235} + 10)}, & q = 2, 4, 6, \\ 1.0, & p, q = 1, 3, 5. \end{cases}$$

$$\kappa_q^{(0)} = \begin{cases} 0.95236837, & q = 2, 4, 6, \\ 1.0, & p, q = 1, 3, 5. \end{cases} \tag{37}$$

$$\kappa_q^{(1)} = \kappa_q^{(3)} = \kappa_q^{(5)} = 1,$$

$$\kappa_q^{(2)} = \begin{cases} 0.73240723, & q = 2, 4, 6, \\ 1.0, & p, q = 1, 3, 5. \end{cases}$$

$$\kappa_q^{(4)} = \begin{cases} 0.81748738, & q = 2, 4, 6, \\ 1.0, & p, q = 1, 3, 5. \end{cases}$$

$$T_p^{(n)} = \sum_{m=0}^{N} B_{mn}c_{pq}\kappa_p^{(m)}\kappa_q^{(m)}S_q^{(m)}. \tag{38}$$

$$T_p^{(n)} = \sum_{m=0}^{N} B_{mn}c_{pq}\kappa_p^{(n)}\kappa_p^{(m)}S_q^{(m)}, \tag{39}$$

$$T_6^{(0)} = 2bc_{66}\alpha^2 u_1^{(1)} + 2b^3 c_{66}\alpha\beta u_1^{(3)}, \tag{40}$$

$$T_6^{(2)} = \frac{2b^3}{3}c_{66}\alpha\beta u_1^{(1)} + \frac{6b^5}{5}c_{66}\beta^2 u_1^{(3)}.$$

$$\left(\alpha^2 - \frac{\Omega^2}{3}\right)\left(\frac{9}{5}\beta^2 - \frac{\Omega^2}{7}\right) = \left(\alpha\beta - \frac{\Omega^2}{5}\right)^2. \tag{41}$$

-continued $$\left(\alpha^2 c_{22} - \frac{b^2}{3}\omega^2\rho\right)A_2^{(1)} + \alpha^2 c_{24}A_3^{(1)} + b^2\left(\alpha\beta c_{22} - \frac{b^2}{5}\omega^2\rho\right)A_2^{(3)} + \quad (42)$$

$$b^2\alpha\beta c_{24}A_3^{(3)} = 0,$$

$$\alpha^2 c_{42}A_2^{(1)} + \left(\alpha^2 c_{44} - \frac{b^2}{3}\omega^2\rho\right)A_3^{(1)} + b^2\alpha\beta c_{42}A_2^{(3)} +$$

$$\left(\alpha\beta c_{44} - \frac{b^2}{5}\omega^2\rho\right)A_3^{(3)} = 0,$$

$$\left(\alpha\beta c_{22} - \frac{b^2}{5}\omega^2\rho\right)A_2^{(1)} + \alpha\beta c_{24}A_3^{(1)} + b^2\left(\frac{9}{5}\beta^2 c_{22} - \frac{b^2}{7}\omega^2\rho\right)A_2^{(3)} +$$

$$\frac{9b^2}{5}\beta^2 c_{22}A_3^{(3)} = 0,$$

$$\alpha\beta c_{42}A_2^{(1)} + \left(\alpha\beta c_{44} - \frac{b^2}{5}\omega^2\rho\right)A_3^{(1)} +$$

$$\frac{9b^2}{5}\beta^2 c_{42}A_2^{(3)} + \left(\frac{9}{5}\beta^2 c_{44} - \frac{b^2}{7}\omega^2\rho\right)A_3^{(3)} = 0.$$

$$\left(\alpha^2 - \frac{\Omega^2}{3}\right)A_1^{(1)} + b^2\left(\alpha\beta - \frac{\Omega^2}{5}\right)A_1^{(3)} + b^4\left(\alpha\delta - \frac{\Omega^2}{7}\right)A_1^{(5)} = 0, \quad (43)$$

$$\left(\alpha\beta - \frac{\Omega^2}{5}\right)A_1^{(1)} + b^2\left(\frac{9}{5}\beta^2 - \frac{\Omega^2}{7}\right)A_1^{(3)} + b^4\left(\frac{15}{7}\beta\delta - \frac{\Omega^2}{9}\right)A_1^{(5)} = 0,$$

$$\left(\alpha\delta - \frac{\Omega^2}{7}\right)A_1^{(1)} + b^2\left(\frac{15}{7}\beta\delta - \frac{\Omega^2}{9}\right)A_1^{(3)} + b^4\left(\frac{25}{9}\delta^2 - \frac{\Omega^2}{11}\right)A_1^{(5)} = 0.$$

What is claimed is:

1. A method for verifying a design of a piezoelectric device which includes a piezoelectric material, the method comprising:

forming a model of the piezoelectric material that considers stress and strain characteristics of the piezoelectric material, wherein the forming of the model includes developing correction factors for a third- or higher-order power-series-based plate theory, wherein the developed correction factors include correction factors for zeroth to nth-order stress-strain relations, where n is an integer greater than or equal to 3 and represents the order of the power-series-based plate theory; and analyzing the model of the piezoelectric material with the at least one developed correction factor to determine at least one vibration frequency characteristic of the piezoelectric material to determine whether the piezoelectric material meets a design specification.

2. The method of claim 1, wherein the at least one vibration frequency characteristic includes a fundamental thickness-shear frequency of the piezoelectric material.

3. The method of claim 1, wherein the at least one vibration frequency characteristic includes coupling characteristics between a thickness-shear vibration mode of the piezoelectric material and at least one other vibration mode of the piezoelectric material.

4. The method of claim 3, wherein the at least one other vibration mode includes a flexural vibration mode.

5. The method of claim 1, wherein the piezoelectric material has a plate configuration and is made of AT-cut quartz crystal.

6. The method of claim 1, wherein the at least one correction factor is developed by forming a stress-strain model of the piezoelectric material.

7. The method of claim 6, wherein the at least one correction factor is developed by further forming a motion model of the piezoelectric material based on the stress-strain model of the piezoelectric material.

8. The method of claim 7, wherein the at least one correction factor is developed by forming a frequency model of the piezoelectric material based on the stress-strain model and the motion model of the piezoelectric material.

9. An apparatus for verifying a design of a piezoelectric device which includes a piezoelectric material, the apparatus comprising:

means for forming a model of the piezoelectric material that considers stress and strain characteristics of the piezoelectric material, wherein the forming of the model includes developing corrections factor for a third- or higher-order power-series-based plate theory, wherein the developed correction factors include correction factors for zeroth to nth-order stress-strain relations, where n is an integer greater than or equal to 3 and represents the order of the power-series-based plate theory; and means for analyzing the model of the piezoelectric material with the at least one developed correction factor to determine at least one vibration frequency characteristic of the piezoelectric material to determine whether the piezoelectric material meets a design specification.

10. The apparatus of claim 9, wherein the at least one vibration frequency characteristic includes a fundamental thickness-shear frequency of the piezoelectric material.

11. The apparatus of claim 9, wherein the at least one vibration frequency characteristic includes coupling characteristics between a thickness-shear vibration mode of the piezoelectric material and at least one other vibration mode of the piezoelectric material.

12. The apparatus of claim 11, wherein the at least one other vibration mode includes a flexural vibration mode.

13. The apparatus of claim 9, wherein the piezoelectric material has a plate configuration and is made of AT-cut quartz crystal.

14. The apparatus of claim 9, wherein the at least one correction factor is developed by forming a stress-strain model of the piezoelectric material.

15. The apparatus of claim 14, wherein the at least one correction factor is developed by further forming a motion model of the piezoelectric material based on the stress-strain model of the piezoelectric material.

16. The apparatus of claim 15, wherein the at least one correction factor is developed by forming a frequency model of the piezoelectric material based on the stress-strain model and the motion model of the piezoelectric material.

17. A machine-readable medium embodying a program of instructions for execution by a machine to perform a method for verifying a design of a piezoelectric device which includes a piezoelectric material, the method comprising:

forming a model of the piezoelectric material that considers stress and strain characteristics of the piezoelectric material, wherein the forming of the model includes developing correction factors for a third- or higher-order power-series-based plate theory, wherein the developed correction factors include correction factors for zeroth to nth-order stress-strain relations, where n is an integer greater than or equal to 3 and represents the order of the power-series-based plate theory: and analyzing the model of the piezoelectric material with the at least one developed correction factor to determine at least one vibration frequency characteristic of the piezoelectric material to determine whether the piezoelectric material meets a design specification.

18. The medium of claim 17, wherein the at least one vibration frequency characteristic includes a fundamental thickness-shear frequency of the piezoelectric material.

19. The medium of claim 17, wherein the at least one vibration frequency characteristic includes coupling characteristics between a thickness-shear vibration mode of the piezoelectric material and at least one other vibration mode of the piezoelectric material.

20. The medium of claim 19, wherein the at least one other vibration mode includes a flexural vibration mode.

21. The medium of claim 17, wherein the piezoelectric material has a plate configuration and is made of AT-cut quartz crystal.

22. The medium of claim 17, wherein the at least one correction factor is developed by forming a stress-strain model of the piezoelectric material.

23. The medium of claim 22, wherein the at least one correction factor is developed by further forming a motion model of the piezoelectric material based on the stress-strain model of the piezoelectric material.

24. The medium of claim 23, wherein the at least one correction factor is developed by forming a frequency model of the piezoelectric material based on the stress-strain model and the motion model of the piezoelectric material.

25. A device comprising:

a piezoelectric material having a plate configuration; and at least one electrode affixed to the piezoelectric material;

wherein a model of the piezoelectric material, including the development of correction factors for a third- or higher-order power-series-based plate theory, is formed and analyzed with the developed correction factors during a design of the device to determine at least one vibration frequency characteristic of the piezoelectric material to determine whether the piezoelectric material meets a design specification to reduce requirements for post-production processing of the device, wherein the model considers stress and strain characteristics of the piezoelectric material, and wherein the developed correction factors include correction factors for zeroth to nth-order stress-strain relations, where n is an integer greater than or equal to 3 and represents the order of the power-series-based plate theory.

* * * * *

UNITED STATES PATENT AND TRADEMARK OFFICE
CERTIFICATE OF CORRECTION

PATENT NO. : 6,654,711 B1  Page 1 of 1
DATED : November 25, 2003
INVENTOR(S) : Ji Wang, et al.

It is certified that error appears in the above-identified patent and that said Letters Patent is hereby corrected as shown below:

<u>Column 16,</u>
Line 9, change "corrections factor" to -- correction factors --.

Signed and Sealed this

Eighth Day of June, 2004

JON W. DUDAS
*Acting Director of the United States Patent and Trademark Office*